United States Patent
Moch (10) Patent No.: US 7,333,051 B2
(45) Date of Patent: Feb. 19, 2008

(54) METHODS AND DEVICES FOR DETERMINING THE LINEARITY OF SIGNALS

(75) Inventor: Thomas A. Moch, Owego, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 75 days.

(21) Appl. No.: 10/992,085

(22) Filed: Nov. 19, 2004

(65) Prior Publication Data

US 2006/0109171 A1  May 25, 2006

(51) Int. Cl.
  G01S 7/40 (2006.01)
  H04B 17/00 (2006.01)
  G01R 23/20 (2006.01)
  G01S 13/00 (2006.01)

(52) U.S. Cl. .......... 342/173; 342/13; 342/20; 342/89; 342/118; 342/128; 342/165; 342/175; 342/195; 332/117; 332/118; 324/612; 324/620; 455/67.11; 455/67.13

(58) Field of Classification Search .......... 342/13–20, 342/89–103, 118, 128–144, 175, 192–197, 342/165–174, 200–204; 455/67.11, 67.13; 332/117, 123–128, 118; 324/612–628
See application file for complete search history.

(56) References Cited

U.S. PATENT DOCUMENTS

| | | |
|---|---|---|
| 3,693,076 A * | 9/1972 | Nugent et al. .......... 324/613 |
| 3,824,466 A | 7/1974 | Olier et al. |
| 3,946,387 A | 3/1976 | Drucker |
| 4,045,658 A | 8/1977 | Peltola et al. |
| 4,107,679 A | 8/1978 | Strauch et al. |
| 4,189,690 A | 2/1980 | Bock et al. |
| 4,199,728 A | 4/1980 | Carpenter |
| 4,244,054 A | 1/1981 | Lorea |
| 4,365,346 A | 12/1982 | Froese et al. |
| 4,388,622 A | 6/1983 | Fletcher, Jr. |
| 4,399,408 A | 8/1983 | Froese et al. |
| 4,399,409 A | 8/1983 | Thompson |
| 4,412,348 A | 10/1983 | Sutphin, Jr. |
| 4,510,465 A | 4/1985 | Rice et al. |
| 4,661,818 A | 4/1987 | Riffiod et al. |
| 4,847,624 A | 7/1989 | Hopwood et al. |
| 4,929,950 A | 5/1990 | Freeman et al. |
| 5,140,256 A | 8/1992 | Hara |
| 5,172,123 A * | 12/1992 | Johnson ................ 342/200 |

(Continued)

FOREIGN PATENT DOCUMENTS

FR   2602105 A1 *  1/1988

(Continued)

*Primary Examiner*—Bernarr E. Gregory
(74) *Attorney, Agent, or Firm*—Harness, Dickey & Pierce P.L.C.

(57) ABSTRACT

A method (for example, machine-implemented, e.g., via a receiver), for determining whether a transmitted pulsed-signal is a linear or non-linear frequency modulated (FM) signal, includes: iteratively determining upper and lower bound slopes associated with frequency components of a pulse of a signal during a time period of the pulse; and comparing each determined upper bound slope to a previous or initial upper bound reference slope and comparing each determined lower bound slope to a previous or initial lower bound reference slope in order to determine the linearity, or non-linearity, of the signal.

38 Claims, 7 Drawing Sheets

U.S. PATENT DOCUMENTS

| | | |
|---|---|---|
| 5,233,609 A | 8/1993 | Hunton |
| 5,289,252 A | 2/1994 | Nourrcier |
| 5,379,001 A | 1/1995 | Hedtke |
| 5,402,449 A | 3/1995 | Schultes et al. |
| 5,642,081 A | 6/1997 | Bosch et al. |
| 5,781,589 A | 7/1998 | Yom |
| H1797 H | 7/1999 | Mosser et al. |
| 6,072,426 A | 6/2000 | Roos |
| 6,420,998 B2 * | 7/2002 | Winter et al. ............... 342/174 |
| 6,437,854 B2 | 8/2002 | Hahlweg |
| 6,498,583 B1 | 12/2002 | Tsai et al. |
| 6,535,162 B1 | 3/2003 | Butler |
| 6,545,634 B1 | 4/2003 | Heide et al. |
| 6,703,969 B2 * | 3/2004 | Winter et al. ............... 342/174 |
| 2001/0052872 A1 | 12/2001 | Hahlweg |
| 2003/0006753 A1 | 1/2003 | Lancaster et al. |

FOREIGN PATENT DOCUMENTS

| | | |
|---|---|---|
| FR | 2668611 A1 | 4/1992 |
| JP | 2000286908 A | 10/2000 |

* cited by examiner

METHODS AND DEVICES FOR DETERMINING THE LINEARITY OF SIGNALS

GOVERNMENT INTERESTS

This invention was made with U.S. Government support. The U.S. Government may have certain rights in this invention.

BACKGROUND OF THE INVENTION

There exists techniques capable of determining whether a signal is a "linear" or "non-linear" frequency modulated (FM) signal. One technique requires the detection of a first or start frequency and an end frequency of a signal. The slope of a line connecting these two frequencies is then used to determine the linearity of the signal.

A signal is considered to be a linear FM signal when, over a given time period, frequency components of the signal fall within a lower or upper bound slope. When this does not occur, the signal is said to be a non-linear FM signal.

Unfortunately, conventional systems that implement this technique require a significant amount of memory and, relatively speaking, a long period of time to determine the linearity of a signal.

More specifically, conventional systems require that all of the components of a given signal (i.e., pulse of a signal) must first be detected and stored in memory before determining the slope of a line connecting a start and end frequency. The time period which elapses between the detection and storage of the components and the subsequent calculation of a slope is unacceptable. In addition, in order to store all of the components, a large amount of memory is required. This is also unacceptable.

Accordingly, it is desirable to provide for techniques which can determine whether a signal is a linear or non-linear FM signal faster than previously thought possible.

It is further desirable to provide for techniques capable of making such determinations using less memory than conventional techniques.

SUMMARY OF THE INVENTION

The present inventor has discovered that it is not necessary to wait until an end frequency is detected to begin to determine the linearity of a signal. Instead, such a determination may: (i) begin after a first frequency component of a signal is received, (ii) be continuously updated after each successive frequency component is received, and (iii) be quickly completed after an end frequency is detected.

Because the linearity determination is begun earlier, the linearity or non-linearity of a signal may be determined faster than previously thought possible.

Because, as explained in more detail below, it is not necessary to store the same amount of frequency information as conventional techniques, the memory capacity needed to carry out linearity tests using the present invention is reduced.

In greater detail, the linearity of a signal may be determined in accordance with one aspect of the present invention by a receiver or the like operable to carry out the following operations: (a) detect a start frequency of a first component of a pulse of a signal; (b) determine an upper reference frequency and a lower reference frequency based on the start frequency; (c) detect a second frequency of a second component of the pulse; (d) determine an initial, upper bound reference slope based on the upper reference frequency and the second frequency; (e) determine an initial, lower bound reference slope based on the lower reference frequency and the second frequency; (f) detect a next frequency component of the pulse; (g) determine a next, upper bound slope based on the detected, next frequency component and the upper reference frequency; (h) determine a next lower bound slope based the detected, next frequency component and the lower reference frequency; (i) compare the so determined next upper bound slope with a previous or initial upper bound reference slope; (j) compare the so determined next lower bound slope with a previous or initial lower bound reference slope; (k) designate the so determined next upper bound slope as a new upper bound reference slope when the next upper bound slope is greater than the previous or initial upper bound reference slope; (l) designate the next lower bound slope as a new lower bound reference slope when the next lower bound slope is less than the previous or initial lower bound reference slope; (m) detect an end frequency of a last component of the pulse; (n) determine a true slope based on the start and end frequencies; (o) compare the true slope to a last designated upper bound reference slope and to a last designated lower bound reference slope; and (p) determine whether the signal comprises a linear FM signal based on the comparison of the true slope to the last designated upper and lower bound reference slopes.

DETAILED DESCRIPTION OF THE INVENTION

Figure 1:
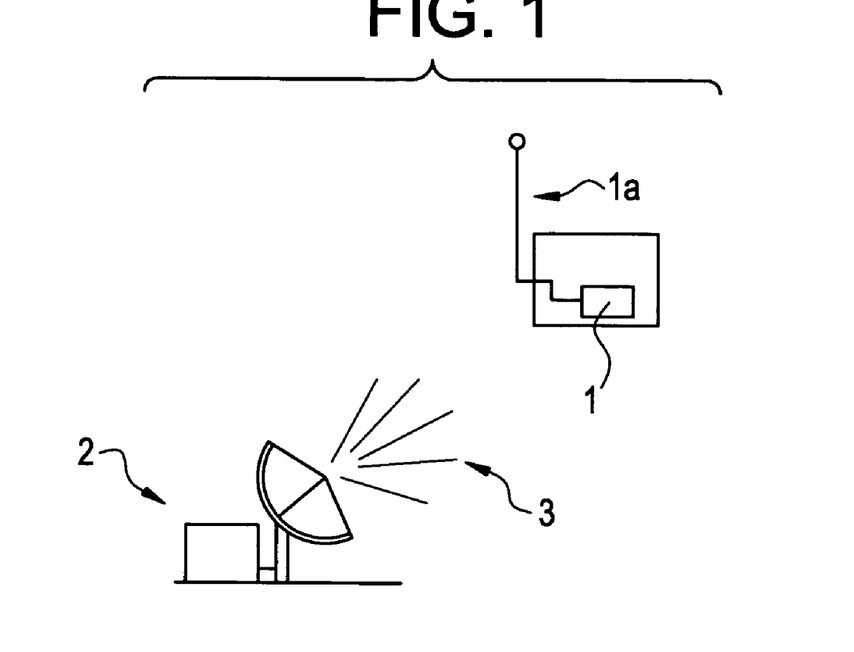
FIG. 1 depicts a receiver capable of detecting FM signals according to an embodiment of the present invention.

Referring now to FIG. 1, there is shown a receiver 1 with antenna 1*a* operable to detect a pulse of a transmitted signal 3 emitted from a source or sources 2 (e.g., radar).

Figure 2:
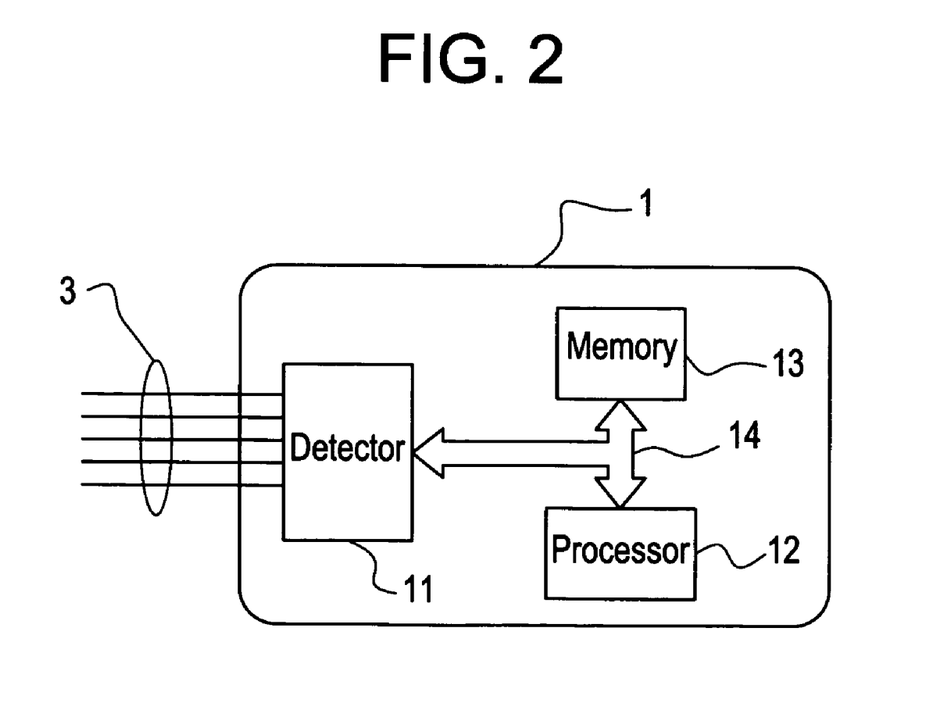
FIG. 2 depicts a simplified drawing of elements of the receiver in FIG. 1 used to determine the linearity, or non-linearity, of signals according to an embodiment of the present invention.

In more detail, yet still simplified, a drawing of receiver 1 is shown in FIG. 2. As shown in FIG. 2, the receiver 1 may comprise a detector 11, processor 12, and memory section 13, all interconnected via a data and signaling bus 14. While shown as three separate elements, it should be understood that the detector 11, processor 12 and memory section 13 may be combined into fewer elements or further broken down into additional elements. For example, the processor 12 and memory 13 may be combined and/or the memory 13 may be further broken down into additional memory sections. In addition, it should be noted that the detector 11 may be a separate unit altogether, distinct from the processor 12 and memory section 13. The receiver 11 may be a satellite, airborne, ground or sea-based receiver.

The processor 12 may be made up of one or more programmable mediums such as a digital signal processor, a microprocessor, or combination of processing elements and memory elements capable of carrying out the features and functions of the present invention described above and below. The processor 12 may comprise on-board memory (not shown) for storing instructions for carrying out the features and functions of the present invention described above and below or these instructions may be stored in memory section 13 or the like and retrieved by processor 12.

The detector 11 may be operable to detect and/or process a wide range of frequencies, including, but not limited to, intermediate frequencies in the 2.0 GHz to 4.0 GHz range.

According to one embodiment of the present invention, the receiver 1 is operable to detect a start frequency, $f_s$, or first frequency of a pulse of signal 3 being transmitted by the source 2. The detection of this start frequency, $f_s$, may be carried out by the antenna 1a in conjunction with the detector 11.

Upon detection of the start or first frequency, $f_s$, the receiver 1 is further operable to determine an upper, $f_u$, and lower, $f_l$, reference frequency based on the start frequency, $f_s$. These upper, $f_u$, and lower, $f_l$, reference frequencies may be viewed as being a maximum frequency "anchor" and a minimum frequency anchor because they will used as fixed reference points to determine the linearity or non-linearity of the pulse over a given time frame.

Figure 3:
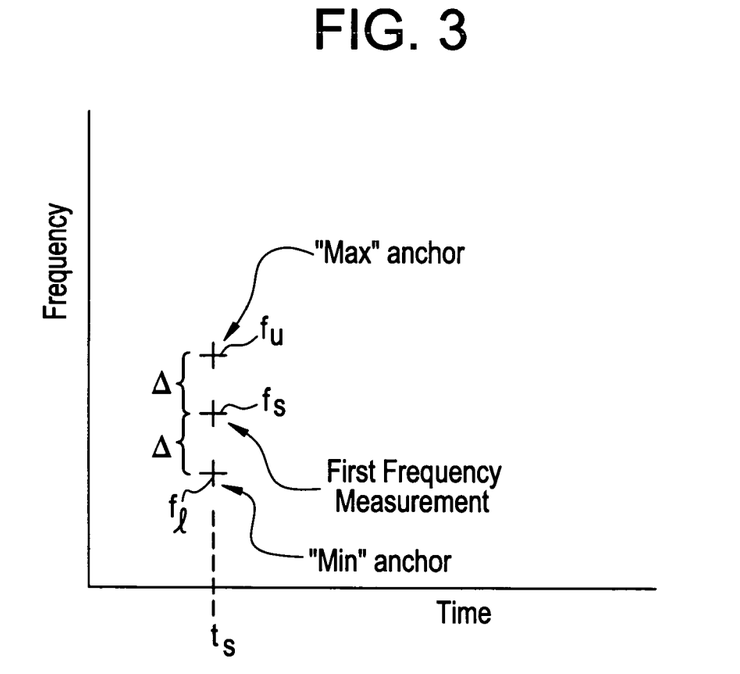
FIGS. 3 through 8 depict frequency vs. time graphs used to illustrate how methods and devices provided by the present invention determine the linearity, or non-linearity, of signals according to embodiments of the present invention.

FIG. 3 depicts one graphic representation of the start frequency, $f_s$, and upper, $f_u$, and lower, $f_l$, reference frequencies.

During a second instant of time, the receiver 1 is further operable to detect a second component of the pulse having a frequency, $f_2$. It should be understood that this second frequency represents the frequency of the second signal component of the pulse which is detected by the receiver 1 shortly after the receiver 1 detects the start or first signal component and its frequency, $f_s$. The value of the detected second frequency may or may not be the same as the start or first frequency depending on the amount of FM that has been applied by source 1.

Figure 4:
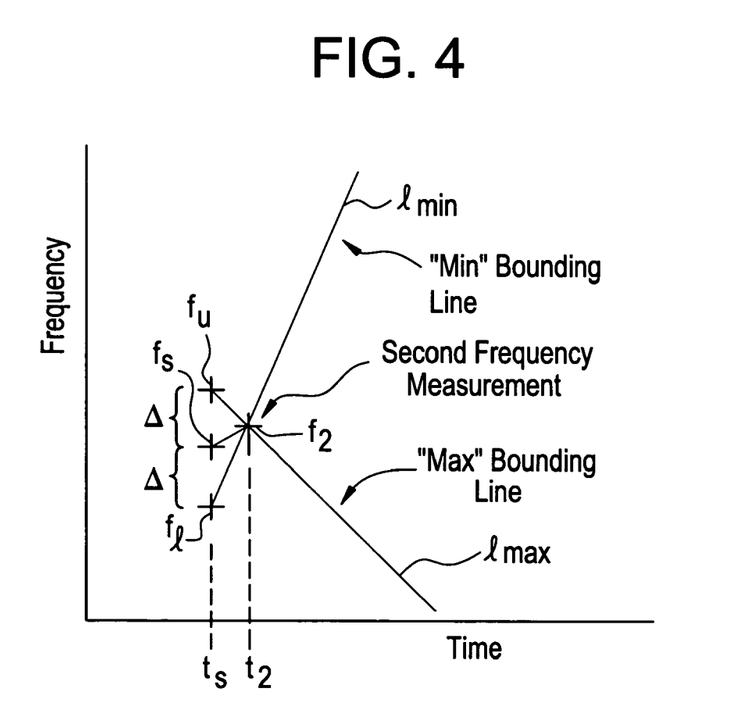

In accordance with one embodiment of the present invention, after detecting the second frequency (using detector 11 or the like), the receiver 1 is further operable to determine an initial reference slope of an upper or maximum frequency bound (e.g., bounding line) based on the upper reference frequency, $f_u$, and the second frequency, $f_2$, and to determine an initial reference slope of a lower or minimum frequency bound (i.e., bounding line) based on the lower reference frequency, $f_l$, and the second frequency, $f_2$. FIG. 4 depicts a simplified illustration of maximum ("Max.") and minimum ("Min") bounding lines, $l_{max}$ and $l_{min}$, respectively, whose initial reference slopes are determined as just discussed by the receiver 1.

After determining the initial reference slopes, and therefore the initial upper and lower bounds represented by bounding lines $l_{max}$ and $l_{min}$, respectively, the receiver 1 is further operable to detect the next frequency of each of one or more next signal components of the pulse within signal 3 during a given time frame (e.g., between the beginning and end of the pulse).

In a further embodiment of the present invention, after each next frequency is detected, the receiver 1 is further operable to determine next upper and lower bound slopes based on the next detected frequency and the appropriate initial or first reference frequency. In this manner, each time the frequency of a next signal component is detected by the receiver 1, an upper and lower bound slope associated with the so-detected frequency is calculated. By carrying out such a determination after each frequency component is detected, the present invention begins the process of determining whether the pulse of a signal 3 comprises a linear or non-linear FM signal in real time, instead of waiting until all of the components of the signal are received, as is done in conventional receivers, etc.

After the next slopes are determined, they may or may not be subsequently used to help determine the linearity of the pulse of signal 3.

In yet another embodiment of the present invention, after a next slope is determined, it is compared with a previous or initial reference slope. For example, a next slope may be compared to the initial slope if this comparison occurs early on; otherwise it is compared with a previous reference slope (i.e., a slope that is determined subsequent to the initial reference slope but previous to the presently determined slope).

In accordance with the present invention, a next slope may be designated as a new reference slope of a respective bound provided: (a) in the case of an upper bound, when the next determined upper bound slope is greater than the previous or initial upper bound reference slope; and (b) in the case of a lower bound, when the next determined lower bound slope is less than a previous or initial lower bound reference slope. Processor 12 may be operable to carry out the process of determining the designation of a next slope as a new upper or lower bound reference slope or non-designation as the case may be.

In general, replacing a previous upper bound or lower bound reference slope with a new reference slope helps ensure that the frequency contribution of the next frequency component is taken in account to determine the linearity, or non-linearity, of signal 3 in real time.

In sum, the present invention provides for continuously determining upper and lower bound slopes associated with the frequency components of a given pulse and comparing such slopes to initial or previous reference slopes in order to eventually determine the linearity or non-linearity of the pulse and signal 3 in real-time.

If it is determined that a slope should be designated as a new reference slope, then memory 13 may be operable to store such a slope. Thereafter, this stored slope (i.e., upper or lower bound reference slope) will be compared against a next slope derived from a next detected frequency component as discussed above. Thus, instead of storing a plurality of frequency components as in conventional techniques, the present invention only requires the storage of a reference slope for each of the upper and lower bounds. This helps reduce the memory required by receiver 1 to determine the linearity of signal 3.

If, on the other hand, a next slope is not designated as a new reference slope, the present invention provides for maintaining the previously stored upper and lower reference slopes for future comparisons, etc. and eventually to determine the linearity, or non-linearity, of signal 3.

This process continues for each next frequency component of signal 3 detected by the receiver 1 until an end frequency, $f_e$, is detected, marking the end of a time period substantially equivalent to the end of the pulse. It should be understood that after each next frequency is detected, the receiver 1 carries out the steps of determining slopes based on the detected frequency and an initial frequency for each of the upper and lower bounds, comparing these next slopes to a previous or initial reference slope and designating or not designating the next slopes as new reference slopes depending on whether these next slopes satisfy the conditions set forth above.

Figure 5:
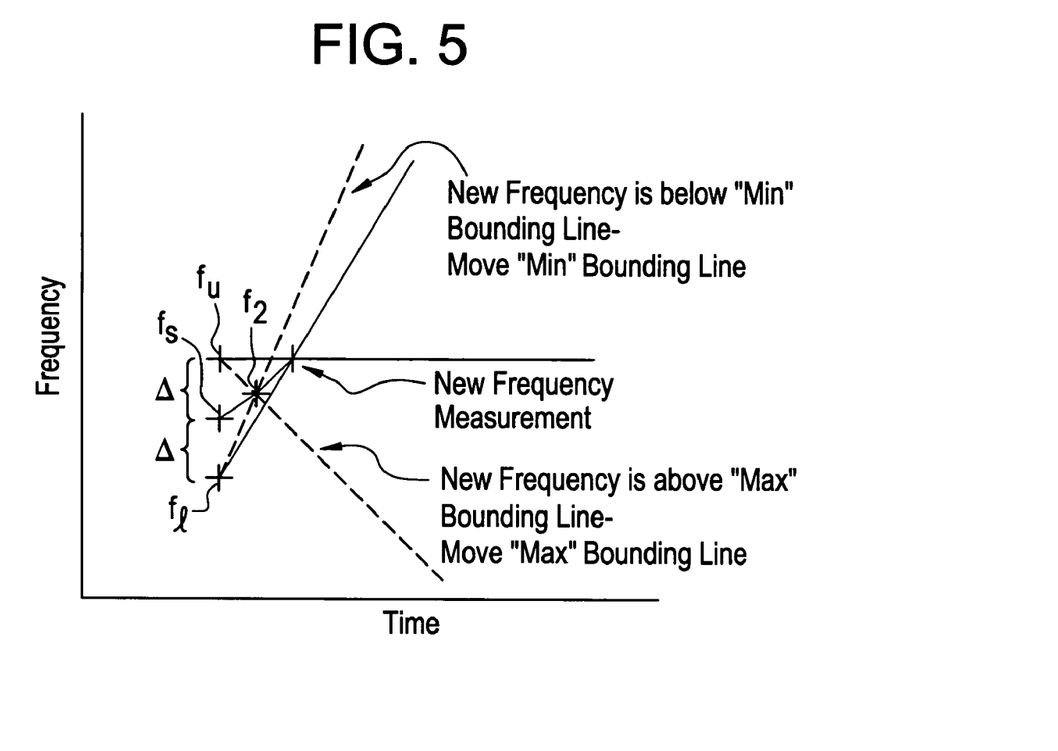
Figure 6:
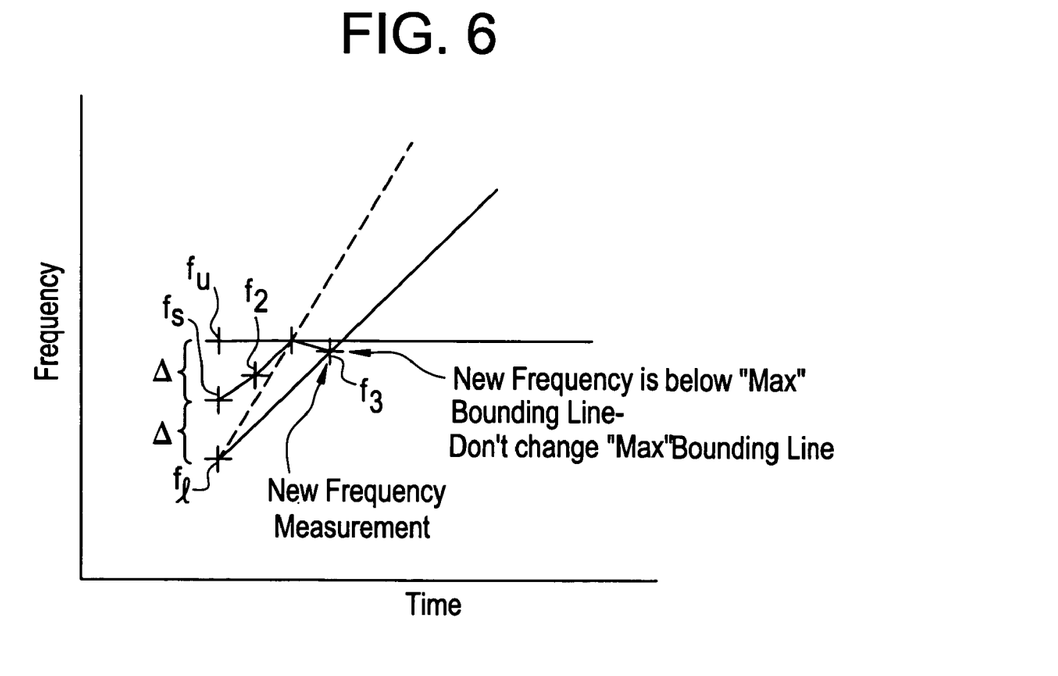

FIG. 5 depicts use of new reference slopes while FIG. 6 depicts the use of previous or initial reference slopes, respectively.

Backtracking, the processor 12 may be operable to carry out the determination of the initial reference slopes and next slopes as well as the comparison of the next slopes to initial or previous reference slopes. Processor 12 may carry out the functions identified above and below in conjunction with the memory section 13. The memory section 13 may also be used to store signal or frequency information. This information may be sent to another device (not shown in FIGS. 1, 2 or 9) that is used to identify the source 2.

Once the receiver 1 detects the end frequency, $f_e$, the receiver 1 (e.g., processor 12 in combination with the memory section 13 or the like) is then further operable to determine a slope based on the start and end frequencies, $f_s$ and $f_e$. That is, using these frequencies as two endpoints, the receiver 1 determines a line connecting these two endpoints and then determines the slope of this line. To distinguish this slope from the other above-mentioned slopes, it will be referred to as a "true" slope.

After the true slope is determined, the receiver 1 is operable to compare the true slope to a last designated upper bound reference slope and, separately, to a last designated lower bound reference slope. Depending on the results of this comparison, the receiver 1 is further operable to determine if the signal 3 is a linear or non-linear FM signal. Again, the processor 12 in conjunction with memory section 13 may be used to carry out these comparisons and determinations.

In yet a further embodiment of the present invention, if these comparisons determine that the last designated upper bound reference slope is less than, or equal to, the true slope and the last designated lower bound reference slope is greater than, or equal to, the true slope, then the receiver 1 is operable to classify the detected signal 3 as a linear FM signal.

However, if either of the two conditions is not met, then the receiver 1 is further operable to classify the detected signal 3 as a non-linear FM signal. That is, if the last designated upper bound reference slope is greater than the true slope or the last designated lower bound reference slope is less than the true slope, then the signal 3 is classified as a non-linear FM signal.

By determining whether a given signal 3 is a linear or non-linear FM signal, it may be possible to identify the characteristics of the source 2 (i.e., the type of source) that is emitting signal 3.

Figure 7:
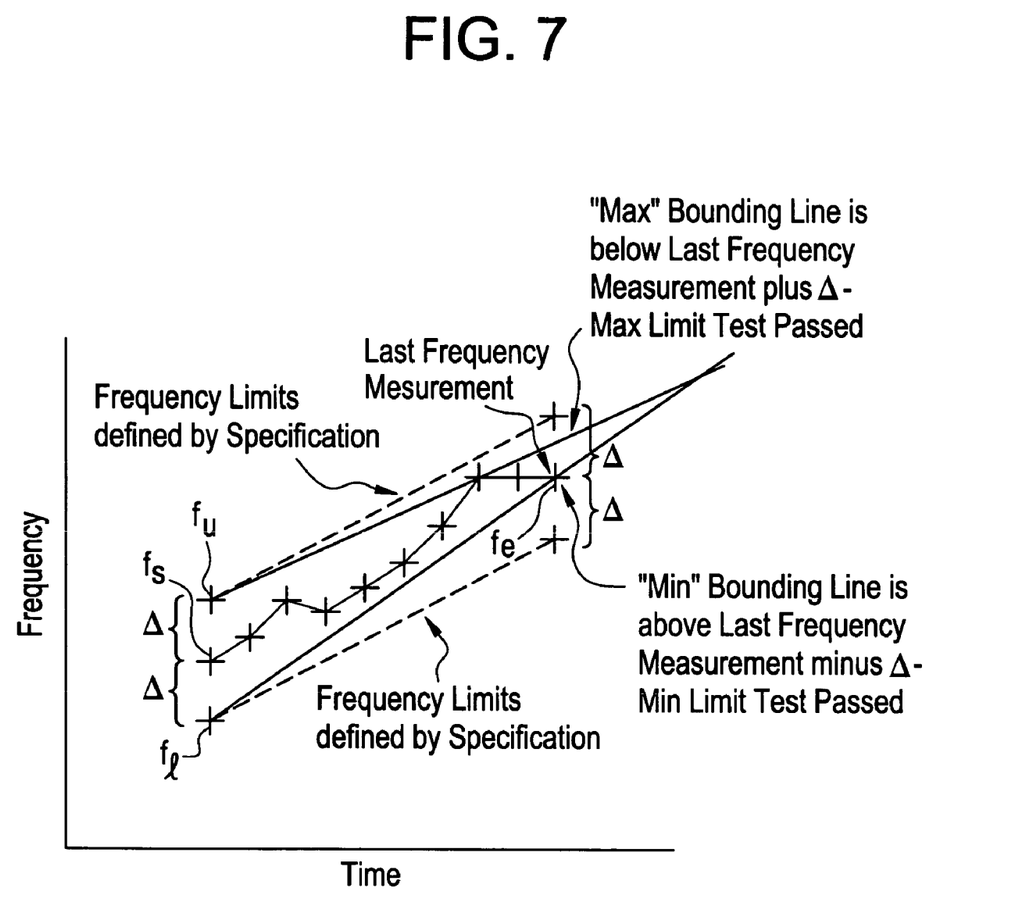
Figure 8:
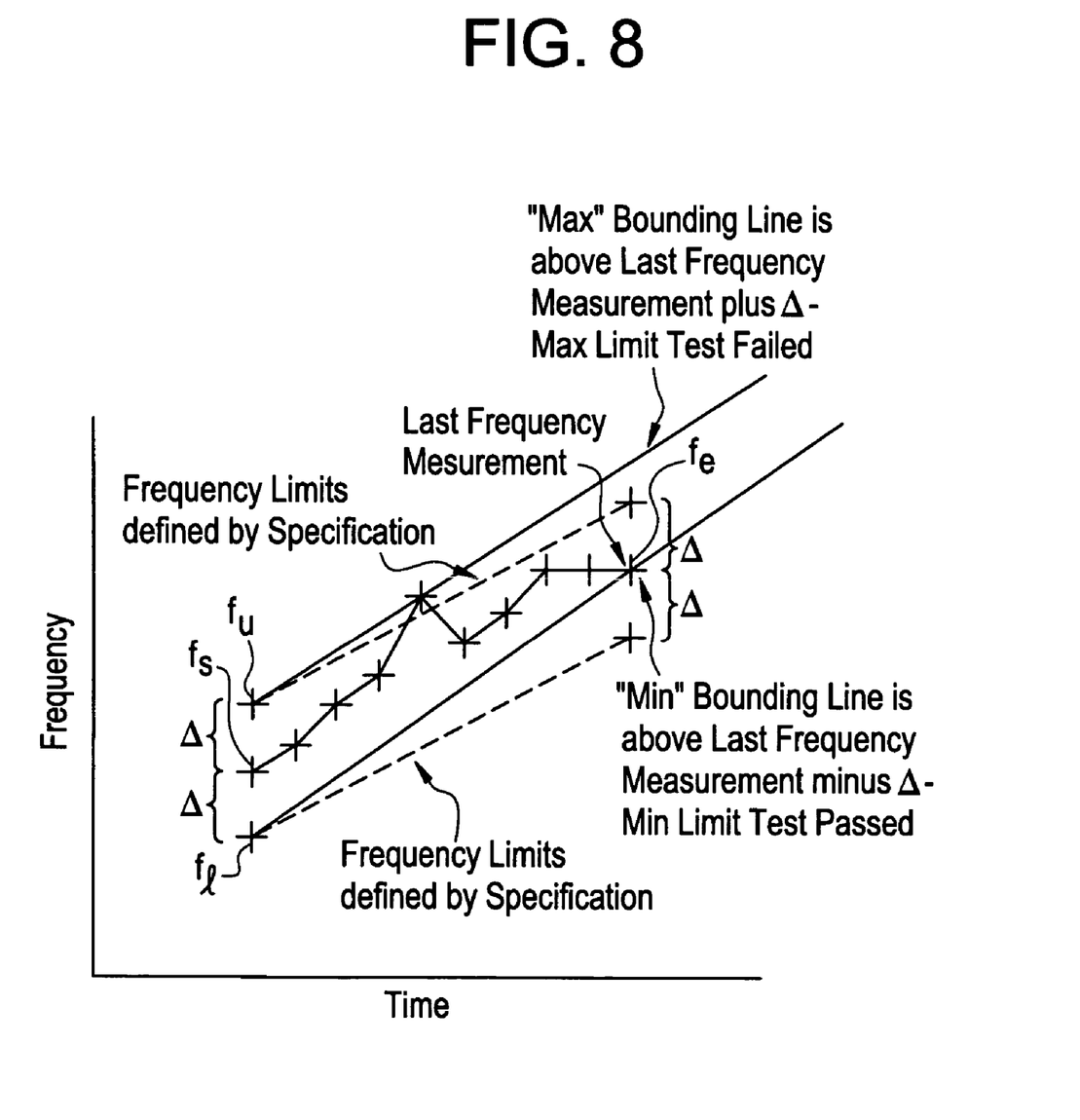

FIG. 7 depicts an example of a situation where a signal is determined to be a linear FM signal while FIG. 8 depicts a situation where a signal is determined to be a non-linear FM signal, respectively. The present inventor has discovered that the time it takes to compare stored upper and lower slopes to a true slope is substantially shorter than the time it takes to generate the slope of a line using conventional techniques. Instead of waiting until all of the components of a pulse of signal 3 are detected to generate a line connecting the start and end frequencies (from which a slope is determined), the present invention begins to estimate this line immediately by continuously comparing next slopes with previously determined reference slopes, etc.

Figure 9:
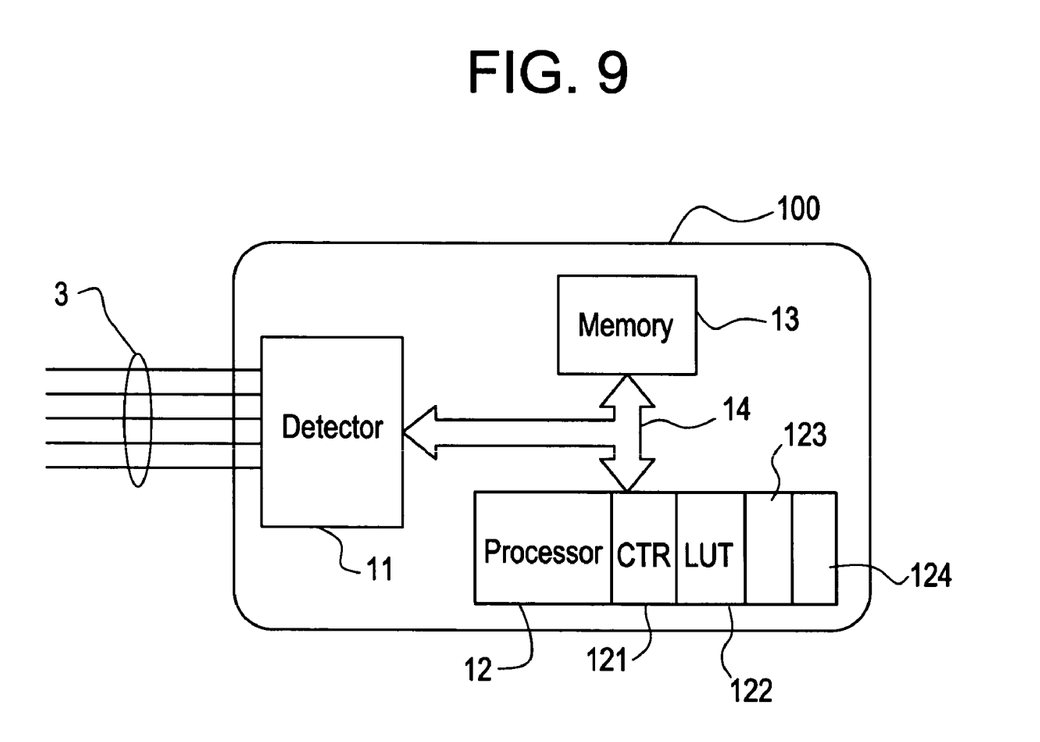
FIG. 9 depicts a receiver capable of detecting FM signals according to yet another embodiment of the present invention.

Referring now to FIG. 9 there is depicted a receiver 100 that is operable to detect signals 3 from source 2 according to yet another embodiment of the present invention.

Receiver 100 is similar to receiver 1 in that it also comprises a detector 11, processor 12, memory section 13 and internal bus 14. In addition, the processor 12 is now shown comprising a counter section 121 ("counter" or "CTR") and look-up table 122 ("LUT" in FIG. 9). The counter 121 and look-up table 122 may be used to determine the next upper or lower bound slopes discussed above.

As mentioned above, the present invention provides for carrying out a linearity test which requires that an upper and lower bound slope be determined each time a next frequency component is detected. In addition, a true slope must be determined when an end frequency is detected.

In general, each of these slopes can be calculated as $$\text{slope} = \frac{\Delta f}{\Delta t}$$

where $\Delta f$ is a frequency difference and can be calculated using means known to one of ordinary skill in the art including using the processor 12 and memory 13 as well as other components (not shown in FIGS. 2 and 9). The value of $\Delta t$ is a count, representing a time period of a pulse, that may be initialized to 0 within counter 121 when the start or first frequency is detected. As indicated above, the difference in frequencies $\Delta f$, is divided by the difference in time $\Delta t$. In general, carrying out division in electronic circuitry and the like is an expensive undertaking, especially when hardware (e.g., timing circuits, gate circuits) is used for this purpose.

To minimize cost, the present invention provides for the use of either a look-up table, such as look-up table 122, or the calculation of a value for $1/\Delta t$ from a previous or current $1/\Delta t$ value using a Taylor Series approximation. These calculations may be carried out by the processor 12 with or without the memory section 13 according to instructions stored within the processor 12 and/or memory section 13.

The present inventors discovered that for a relatively short or small time period (e.g., the time between the detection of start and end frequencies of a pulse) a Taylor Series generates excessive errors. In comparison, when a relatively large time period is used, the size of the look-up table becomes excessive.

Accordingly, in a further embodiment of the present invention, a look-up table, such as look-up table 122, may be used to calculate the value of $1/\Delta t$ when the time period of a pulse (i.e., time period between a start and end frequency) is relatively small. For example, when the time period is less than, or equal to, 6.4 microseconds. Conversely, when the time period is relatively long (e.g., greater than 6.4 microseconds), a Taylor Series approximation may be used to calculate the value of $1/\Delta t$. More specifically, a three-term Taylor Series given by Equation (2) below is used to calculate the value of $1/\Delta t$.

Figure 10:
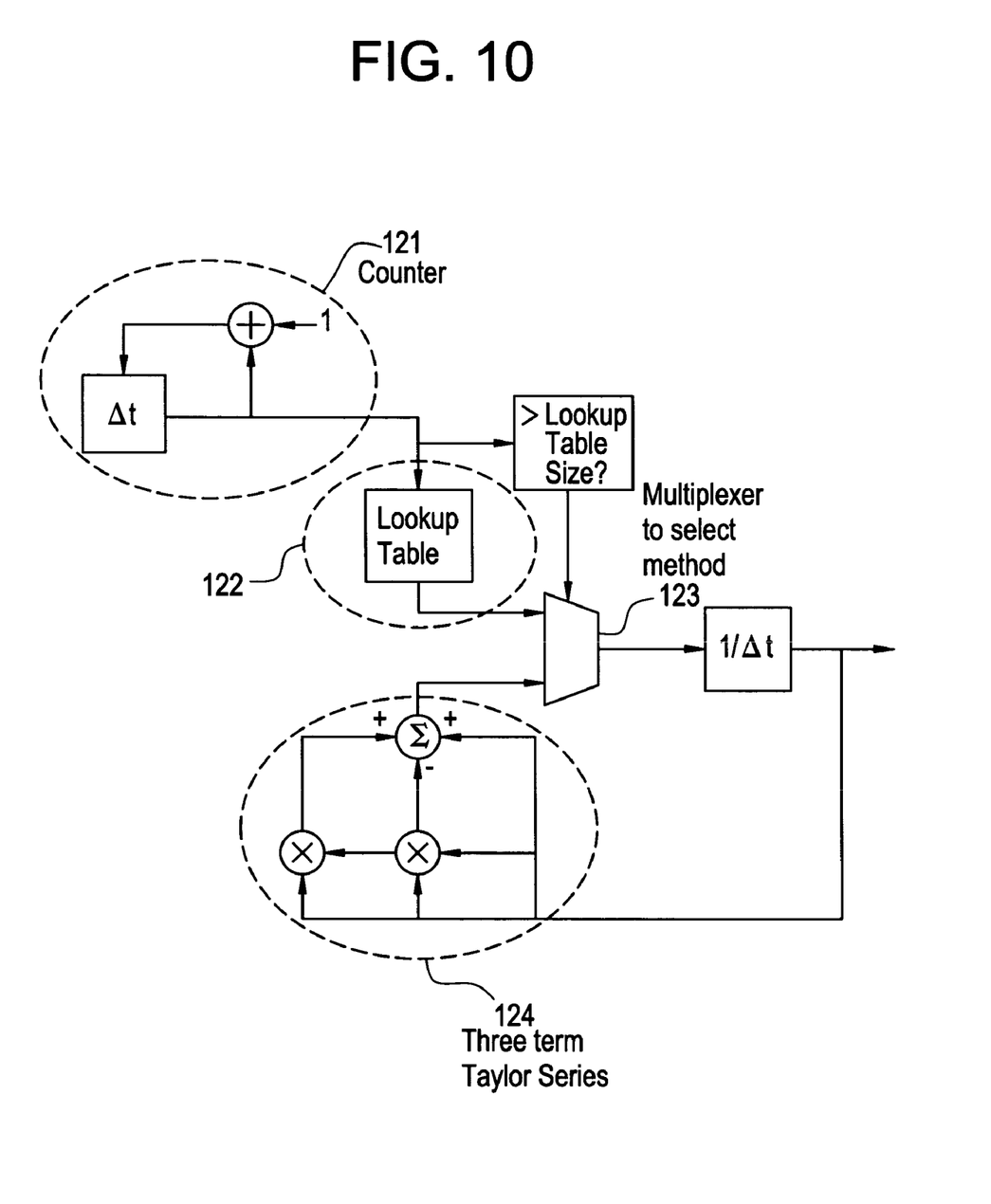
FIG. 10 depicts a diagram of logical blocks of the receiver in FIG. 9 used in determining the linearity, or non-linearity, of signals according to embodiments of the present invention.

FIG. 10 depicts a simplified diagram of functional blocks 121 through 124 which may be used to calculate the value of $1/\Delta t$ in conjunction with processor 12, etc. Each of these functional blocks may in fact be a part of the processor 12 or may be separate elements of the receiver 100.

As mentioned above, the value of $1/\Delta t$ may be determined using a three-term Taylor Series. Such a series may be determined as follows:

Let:
$f(x)=1/(\Delta t+1)$ be the next sequential value of $1/\Delta t$ to be determined and
$f(a)=1\Delta t$ be the present value of $1/\Delta t$ Then:

$$\frac{1}{\Delta t+1} = \frac{1}{\Delta t} + (1)\frac{-1}{(\Delta t)^2} + \frac{(1)^2}{2!}\frac{+2}{(\Delta t)^3} + \cdots - \frac{(1)^n}{n!}\frac{(-1)^n n!}{(\Delta t)^{n+1}} + \cdots \quad (1)$$

Equation (1) can be simplified to:

$$\frac{1}{\Delta t+1} = \frac{1}{\Delta t} - \left(\frac{1}{\Delta t}\right)^2 + \left(\frac{1}{\Delta t}\right)^3 - \cdots + (-1)^n\left(\frac{1}{\Delta t}\right)^{n+1} + \cdots \quad (2)$$

In a further embodiment of the present invention, n+1 terms of the Taylor Series represented by Equation (2) may be used to calculate the value of 1/Δt. More specifically, the greater the number of n+1 terms the greater the accuracy of the 1/Δt calculation. Depending on the accuracy required by a particular application, a user or processor 12 may select the number of n+1 terms used in Equation (2) to calculate the value of 1/Δt.

The above discussion has attempted to set forth some examples of the present invention. It should be understood, however, that the true scope of the present invention is defined by the claims which follow.

What is claimed is:

1. A method for determining whether a transmitted, pulsed signal is a linear or non-linear frequency modulated (FM) signal comprising:
   (a) detecting a start frequency of a first component of a pulse of a signal;
   (b) determining an upper reference frequency and a lower reference frequency based on the start frequency;
   (c) detecting a second frequency of a second component of the pulse;
   (d) determining an initial, upper bound reference slope based on the upper reference frequency and the second frequency;
   (e) determining an initial, lower bound reference slope based on the lower reference frequency and the second frequency;
   (f) detecting a next frequency component of the pulse;
   (g) determining a next, upper bound slope based on the detected, next frequency component and the upper reference frequency;
   (h) determining a next lower bound slope based on the detected, next frequency component and the lower reference frequency;
   (i) comparing the so determined next upper bound slope with a previous or initial upper bound reference slope;
   (j) comparing the so determined next lower bound slope with a previous or initial lower bound reference slope;
   (k) designating the so determined next upper bound slope as a new upper bound reference slope when the next upper bound slope is greater than the previous or initial upper bound reference slope;
   (l) designating the next lower bound slope as a new lower bound reference slope when the next lower bound slope is less than the previous or initial lower bound reference slope;
   (m) detecting an end frequency of a last component of the pulse;
   (n) determining a true slope based on the start and end frequencies;
   (o) comparing the true slope to a last designated upper bound reference slope and to a last designated lower bound reference slope; and
   (p) determining whether the signal comprises a linear FM signal based on the comparison of the true slope to the last designated upper and lower bound reference slopes.

2. The method as in claim 1 further comprising classifying the signal as a linear, FM signal when the last designated upper bound reference slope is less than or equal to the true slope and the last designated lower bound reference slope is greater than or equal to the true slope.

3. The method as in claim 1 further comprising classifying the signal as a non-linear, FM signal when the last designated upper bound reference slope is greater than the true slope or the last designated lower bound reference slope is less than the true slope.

4. The method as in claim 1 further comprising repeating steps (f) through (l) for each next frequency component of the pulse until the end frequency is detected.

5. The method as in claim 1 further comprising determining the slopes using a look-up table when a time period between the detection of start and end frequencies is small or using a Taylor-series approximation when the time period is long.

6. The method as in claim 5 further comprising determining the slopes using the look-up table when the time period is less than, or equal to, 6.4 microseconds or using the Taylor-series approximation when the time period is greater than 6.4 microseconds.

7. A receiver for determining whether a transmitted, pulsed signal is a linear or non-linear frequency modulated (FM) signal, the receiver comprising a frequency detector and a processor respectively operable to:
   (a) detect a start frequency of a first component of a pulse of a signal;
   (b) determine an upper reference frequency and a lower reference frequency based on the start frequency; (c) detect a second frequency of a second component of the pulse;
   (d) determine an initial, upper bound reference slope based on the upper reference frequency and the second frequency;
   (e) determine an initial, lower bound reference slope based on the lower reference frequency and the second frequency;
   (f) detect a next frequency component of the pulse;
   (g) determine a next, upper bound slope based on the detected, next frequency component and the upper reference frequency;
   (h) determine a next lower bound slope based on the detected, next frequency component and the lower reference frequency;
   (i) compare the so determined next upper bound slope with a previous or initial upper bound reference slope;
   (j) compare the so determined next lower bound slope with a previous or initial lower bound reference slope;
   (k) designate the so determined next upper bound slope as a new upper bound reference slope when the next upper bound slope is greater than the previous or initial upper bound reference slope;
   (l) designate the next lower bound slope as a new lower bound reference slope when the next lower bound slope is less than the previous or initial lower bound reference slope;
   (m) detect an end frequency of a last component of the pulse;

(n) determine a true slope based on the start and end frequencies;

(o) compare the true slope to a last designated upper bound reference slope and to a last designated lower bound reference slope; and (p) determine whether the signal comprises a linear FM signal based on the comparison of the true slope to the last designated upper and lower bound reference slopes.

8. The receiver as in claim 7, wherein the processor is further operable to classify the signal as a linear, FM signal when the last designated upper bound reference slope is less than or equal to the true slope and the last designated lower bound reference slope is greater than or equal to the true slope.

9. The receiver as in claim 7, wherein the processor is further operable to classify the signal as a non-linear, FM signal when the last designated upper bound reference slope is greater than the true slope or the last designated lower bound reference slope is less than the true slope.

10. The receiver as in claim 7, wherein the detector and the processor respectively are further operable to repeat steps (f) through (l) for each next component of the signal until the end frequency is detected.

11. The receiver as in claim 7, wherein the processor is further operable to: determine the slopes using a look-up table when a time period between the detection of start and end frequencies is small; and determine the slopes using a Taylor-series approximation when the time period is long.

12. The receiver as in claim 11, wherein the processor is further operable to determine the slopes using the look-up table when the time period is less than, or equal to, 6.4 microseconds or using the Taylor-series approximation when the time period is greater than 6.4 microseconds.

13. A method for determining whether a transmitted, pulsed signal is a linear or non-linear frequency modulated (FM) signal comprising:

(a) detecting a start frequency of a first component of a pulse of a signal;

(b) determining an upper reference frequency and a lower reference frequency based on the start frequency;

(c) detecting a second frequency of a second component of the pulse;

(d) determining an initial, upper bound reference slope based on the upper reference frequency and the second frequency;

(e) determining an initial, lower bound reference slope based on the lower reference frequency and the second frequency;

(f) detecting a next frequency component of the pulse;

(g) determining a next, upper bound slope based on the detected, next frequency component and the upper reference frequency;

(h) determining a next lower bound slope based on the detected, next frequency component and the lower reference frequency;

(i) comparing the so determined next upper bound slope with a previous or initial upper bound reference slope;

(j) comparing the so determined next lower bound slope with a previous or initial lower bound reference slope;

(k) designating the so determined next upper bound slope as a new upper bound reference slope when the next upper bound slope is greater than the previous or initial upper bound reference slope;

(l) designating the next lower bound slope as a new lower bound reference slope when the next lower bound slope is less than the previous or initial lower bound reference slope;

(m) detecting an end frequency of a last component of the pulse;

(n) determining a true slope based on the start and end frequencies;

(o) comparing the true slope to a last designated upper bound reference slope and to a last designated lower bound reference slope; and (p) determining whether the signal comprises a linear FM signal based on the comparison of the true slope to the last designated upper and lower bound reference slopes, wherein the slopes are determined using a look-up table when a time period between the detection of the start and end frequencies is small or a Taylor-series approximation when the time period is long.

14. A receiver for determining whether a transmitted, pulsed signal is a linear or non-linear frequency modulated (FM) signal, the receiver comprising a frequency detector and a processor respectively operable to:

(a) detect a start frequency of a first component of a pulse of a signal;

(b) determine an upper reference frequency and a lower reference frequency based on the start frequency;

(c) detect a second frequency of a second component of the pulse;

(d) determine an initial, upper bound reference slope based on the upper reference frequency and the second frequency;

(e) determine an initial, lower bound reference slope based on the lower reference frequency and the second frequency;

(f) detect a next frequency component of the pulse;

(g) determine a next, upper bound slope based on the detected, next frequency component and the upper reference frequency;

(h) determine a next lower bound slope based on the detected, next frequency component and the lower reference frequency;

(i) compare the so determined next upper bound slope with a previous or initial upper bound reference slope;

(j) compare the so determined next lower bound slope with a previous or initial lower bound reference slope;

(k) designate the so determined next upper bound slope as a new upper bound reference slope when the next upper bound slope is greater than the previous or initial upper bound reference slope;

(l) designate the next lower bound slope as a new lower bound reference slope when the next lower bound slope is less than the previous or initial lower bound reference slope;

(m) detect an end frequency of a last component of the pulse;

(n) determine a true slope based on the start and end frequencies;

(o) compare the true slope to a last designated upper bound reference slope and to a last designated lower bound reference slope; and (p) determine whether the signal comprises a linear FM signal based on the comparison of the true slope to the last designated upper and lower bound reference slopes, wherein the slopes are determined using a look-up table when a time period between the detection of the start and end frequencies is small or using a Taylor-series approximation when the time period is long.

15. A receiver for determining whether a transmitted, pulsed signal is a linear or non-linear frequency modulated (FM) signal, the receiver comprising a frequency detector and a processor respectively operable to:
   (a) determine an initial, upper bound reference slope based on an upper reference frequency and a second frequency of a pulse that is detected;
   (b) determine an initial, lower bound reference slope based on a lower reference frequency and the second frequency;
   (c) detect a next frequency component of the pulse;
   (d) determine a next, upper bound slope based on the detected, next frequency component and the upper reference frequency;
   (e) determine a next lower bound slope based on the detected, next frequency component and the lower reference frequency;
   (f) compare the so determined next upper bound slope with a previous or initial upper bound reference slope;
   (g) compare the so determined next lower bound slope with a previous or initial lower bound reference slope;
   (h) designate the so determined next upper bound slope as a new upper bound reference slope when the next upper bound slope is greater than the previous or initial upper bound reference slope;
   (i) designate the next lower bound slope as a new lower bound reference slope when the next lower bound slope is less than the previous or initial lower bound reference slope;
   (j) detect an end frequency of a last component of the pulse;
   (k) determine a true slope based on a start frequency and the end frequency;
   (l) compare the true slope to a last designated upper bound reference slope and to a last designated lower bound reference slope; and
   (m) determine whether the signal comprises a linear FM signal based on the comparison of the true slope to the last designated upper and lower bound reference slopes, wherein the slopes are determined using a look-up table when a time period between the detection of the start and end frequencies is small or using a Taylor-series approximation when the time period is long.

16. The receiver as in claim 15, wherein the processor is further operable to classify the signal as a non-linear, FM signal when the last designated upper bound reference slope is greater than the true slope or the last designated lower bound reference slope is less than the true slope.

17. The receiver as in claim 15, wherein the detector and the processor respectively are further operable to repeat steps (c) through (i) for each next component of the signal until the end frequency is detected.

18. The receiver as in claim 15, wherein the processor is further operable to determine the slopes using the look-up table when the time period is less than, or equal to, 6.4 microseconds or using the Taylor-series approximation when the time period is greater than 6.4 microseconds.

19. A method for determining whether a transmitted, pulsed signal is a linear or non-linear frequency modulated (FM) signal comprising:
   (a) determining an initial, upper bound reference slope based on an upper reference frequency and a second frequency of a pulse that is detected;
   (b) determining an initial, lower bound reference slope based on a lower reference frequency and the second frequency;
   (c) detecting a next frequency component of the pulse;
   (d) determining a next, upper bound slope based on the detected, next frequency component and the upper reference frequency;
   (e) determining a next lower bound slope based on the detected, next frequency component and the lower reference frequency;
   (f) comparing the so determined next upper bound slope with a previous or initial upper bound reference slope;
   (g) comparing the so determined next lower bound slope with a previous or initial lower bound reference slope;
   (h) designating the so determined next upper bound slope as a new upper bound reference slope when the next upper bound slope is greater than the previous or initial upper bound reference slope;
   (i) designating the next lower bound slope as a new lower bound reference slope when the next lower bound slope is less than the previous or initial lower bound reference slope;
   (j) detecting an end frequency of a last component of the pulse;
   (k) determining a true slope based on a start frequency and the end frequency;
   (l) comparing the true slope to a last designated upper bound reference slope and to a last designated lower bound reference slope; and
   (m) determining whether the signal comprises a linear FM signal based on the comparison of the true slope to the last designated upper and lower bound reference slopes, wherein the slopes are determined using a look-up table when a time period between the detection of the start and end frequencies is small or using a Taylor-series approximation when the time period is long.

20. A machine-readable medium having machine-implementable instructions for determining whether a transmitted, pulsed signal is a linear or non-linear frequency modulated (FM) signal, execution of the machine-implementable instructions rendering a machine operable to:
   (a) determine an initial, upper bound reference slope based on an upper reference frequency and a second frequency of a pulse that is detected;
   (b) determine an initial, lower bound reference slope based on a lower reference frequency and the second frequency;
   (c) detect a next frequency component of the pulse;
   (d) determine a next, upper bound slope based on the detected, next frequency component and the upper reference frequency;
   (e) determine a next lower bound slope based the detected, next frequency component and the lower reference frequency;
   (f) compare the so determined next upper bound slope with a previous or initial upper bound reference slope;
   (g) compare the so determined next lower bound slope with a previous or initial lower bound reference slope;
   (h) designate the so determined next upper bound slope as a new upper bound reference slope when the next upper bound slope is greater than the previous or initial upper bound reference slope;
   (i) designate the next lower bound slope as a new lower bound reference slope when the next lower bound slope is less than the previous or initial lower bound reference slope;

(j) detect an end frequency of a last component of the pulse;

(k) determine a true slope based on a start frequency and the end frequency;

(l) compare the true slope to a last designated upper bound reference slope and to a last designated lower bound reference slope; and (m) determine whether the signal comprises a linear FM signal based on the comparison of the true slope to the last designated upper and lower bound reference slopes, wherein the slopes are determined using a look-up table when a time period between the detection of the start and end frequencies is small or using a Taylor-series approximation when the time period is long.

21. The programmable medium as in claim 20 further operable to classify the signal as a linear, FM signal when the last designated upper bound reference slope is less than or equal to the true slope and the last designated lower bound reference slope is greater than or equal to the true slope based on stored instructions.

22. The programmable medium as in claim 20, wherein execution of the machine-implemented instructions renders the machine further operable to classify the signal as a non-linear, FM signal when the last designated upper bound reference slope is greater than the true slope or the last designated lower bound reference slope is less than the true slope based on stored instructions.

23. The programmable medium as in claim 20, wherein execution of the machine-implemented instructions renders the machine further operable to repeat steps (c) through (i) for each next component of the signal until the end frequency is detected based on stored instructions.

24. The programmable medium as in claim 20, wherein execution of the machine-implemented instructions renders the machine further operable to determine the slopes using the look-up table when the time period is less than, or equal to, 6.4 microseconds or using the Taylor-series approximation when the time period is greater than 6.4 microseconds based on stored instructions.

25. A machine-implemented method for determining whether a transmitted, pulsed signal is a linear or non-linear frequency modulated (FM) signal, machine-implemented steps of the method comprising:

iteratively determining upper and lower bound slopes associated with frequency components of a pulse of a signal during a time period of the pulse; and comparing each determined upper bound slope to a previous or initial upper bound reference slope and comparing each determined lower bound slope to a previous or initial lower bound reference slope in order to determine the linearity, or non-linearity, of the signal.

26. The method as in claim 25 further comprising the machine-implemented step of determining the slopes using a look-up table when a time period between the detection of start and end frequencies of the pulse is small or using a Taylor-series approximation when the time period is long.

27. The method as in claim 26 further comprising wherein the machine-implemented step of determining the slopes includes:

selecting the look-up table when the time period is less than, or equal to, 6.4 microseconds, else selecting the Taylor-series approximation when the time period is greater than 6.4 microseconds.

28. A receiver, for determining whether a transmitted, pulsed signal is a linear or non-linear frequency modulated (FM) signal, the receiver comprising a frequency detector and a processor respectively operable to:

iteratively determine upper and lower bound slopes associated with frequency components of a pulse of a signal during a time period of the pulse; and compare each determined upper bound slope to a previous or initial upper bound reference slope and compare each determined lower bound slope to a previous or initial lower bound reference slope in order to determine the linearity, or non-linearity, of the signal.

29. The receiver as in claim 28, wherein the processor is further operable to determine the slopes using a look-up table when a time period between the detection of start and end frequencies of the pulse is small or using a Taylor-series approximation when the time period is long.

30. The receiver as in claim 29, wherein the processor is further operable to determine the slopes using the look-up table when the time period is less than, or equal to, 6.4 microseconds or using the Taylor-series approximation when the time period is greater than 6.4 microseconds.

31. A machine-implemented method for determining whether a transmitted, pulsed signal is a linear or non-linear frequency modulated (FM) signal, machine-implemented steps of the method comprising:

iteratively refining, before elapse of an interval approximating a duration of a pulse of the signal, at least one figure of merit based upon a first portion and at least a subsequent second portion of a received pulse, respectively; and determining, after the interval has elapsed, whether or not the signal is linear based upon at least the refined figure of merit.

32. The method as in claim 31, wherein:

there are at least a first and second figure of merit; and the first and second figures of merit are upper and lower bound slopes associated with frequency components of the pulse.

33. The machine-implemented method as in claim 32, wherein the machine-implemented step of iteratively refining includes:

determining the upper and lower bound slopes based upon the first portion; and refining each determined bound slope at least once based upon at least the subsequent second portion, respectively.

34. The method as in claim 31, wherein the machine-implemented steps further comprise:

determining the at least one figure of merit using a look-up table when the interval is less than an reference duration, else using a Taylor-series approximation.

35. A receiver, for determining whether a transmitted, pulsed signal is a linear or non-linear frequency modulated (FM) signal, the receiver comprising a frequency detector and a processor respectively operable to:

iteratively refine, before elapse of an interval approximating a duration of a pulse of the signal, at least one figure of merit based upon a first portion and at least a subsequent second portion of a received pulse, respectively; and determining, after the interval has elapsed, whether or not the signal is linear based upon at least the refined figure of merit.

36. The receiver as in claim 35, wherein:

there are at least a first and second figure of merit; and the first and second figures of merit are upper and lower bound slopes associated with frequency components of the pulse.

37. The receiver as in claim 36, wherein the processor is further operable to iteratively refine by:
  determining the upper and lower bound slopes based upon the first portion; and
  refining each determined bound slope at least once based upon at least the subsequent second portion, respectively.

38. The receiver as in claim 35, wherein the processor is further operable to determine the at least one figure of merit using a look-up table when the interval is less than an reference duration, else using a Taylor-series approximation.

* * * * *